US009423482B2

(12) United States Patent
Herzer et al.

(10) Patent No.: US 9,423,482 B2
(45) Date of Patent: Aug. 23, 2016

(54) SENSOR ARRANGEMENT AND METHOD

(71) Applicant: FRAUNHOFER-GESELLSCHAFT ZUR FOERDERUNG DER ANGEWANDTEN FORSCHUNG E.V., Munich (DE)

(72) Inventors: Elmar Herzer, Erlangen (DE); Ulrich Schlag, Erlangen (DE); Josef Sauerer, Herzogenaurach (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 483 days.

(21) Appl. No.: 14/064,082

(22) Filed: Oct. 25, 2013

(65) Prior Publication Data
US 2014/0055146 A1 Feb. 27, 2014

Related U.S. Application Data

(63) Continuation of application No. PCT/EP2012/056947, filed on Apr. 16, 2012.

(51) Int. Cl.
*G01R 27/08* (2006.01)
*G01B 7/30* (2006.01)
(Continued)

(52) U.S. Cl.
CPC .............. *G01R 35/005* (2013.01); *G01D 3/028* (2013.01)

(58) Field of Classification Search
CPC ......... G01D 5/145; G01D 5/12; G01D 5/142; G01D 3/028; G01D 5/14; G01D 5/16; G01D 5/24; G01D 5/244; G01D 5/245; G01D 5/2451; G01D 5/26; G01R 21/00; G01R 19/00

USPC .............. 324/601, 465, 207.13, 207.14, 219, 324/220, 234, 239, 241–247, 529, 530, 324/177–179, 416, 750.07, 76.79–76.81, 324/123 C, 354, 370, 222, 522, 713, 164, 324/127–137, 76.11, 115, 600, 649, 691, 324/720; 361/30, 31, 33, 78, 79, 87; 327/307, 306, 100; 702/1, 57, 64, 127
See application file for complete search history.

(56) References Cited

U.S. PATENT DOCUMENTS 5,218,311 A * 6/1993 Jagiella .................... G01B 7/00
324/658
5,260,614 A 11/1993 Theus et al.
(Continued)

FOREIGN PATENT DOCUMENTS

DE 10022013 6/2001
DE 4042740 9/2004
(Continued)

*Primary Examiner* — Patrick Assouad
*Assistant Examiner* — Taqi Nasir
(74) *Attorney, Agent, or Firm* — Perkins Coie LLP; Michael A. Glenn

(57) ABSTRACT

A sensor arrangement has a current regulator, a reference resistance a feed current scaler and a sensor element having an internal resistance, the internal resistance of the sensor element and the reference resistance having a predetermined ratio. The current regulator is implemented to provide a reference current by the reference resistance and to change the reference current in response to an interference influence-conditioned change of the reference resistance such that the voltage decreasing across the reference resistance remains in a predetermined range around an applied set voltage. The current regulator is implemented to provide a feed current to the feed current scaler and to change a magnitude of the feed current depending on a magnitude of the reference current. The feed current scaler is implemented to feed a scaled feed current into the sensor element to scale a voltage according to the scaling of the feed current.

27 Claims, 7 Drawing Sheets

(51) Int. Cl.
  *G01R 35/00* (2006.01)
  *G01D 3/028* (2006.01)

(56) References Cited

U.S. PATENT DOCUMENTS 7,701,207 B2  4/2010  Rossmann et al.
2003/0178989 A1*  9/2003  Vig .................. G01D 5/147
                                              324/207.2

FOREIGN PATENT DOCUMENTS

| DE | 102008043966 | 5/2010 |
| DE | 102004010362 | 11/2010 |
| EP | 0464391 | 6/1991 |
| EP | 0525235 | 7/1991 |
| JP | H02306183 A | 12/1990 |
| JP | H5251786 A | 9/1993 |
| JP | 2010181211 A | 8/2010 |

* cited by examiner

SENSOR ARRANGEMENT AND METHOD

CROSS-REFERENCE TO RELATED APPLICATIONS

This application is a continuation of copending International Application No. PCT/EP2012/056947, filed Apr. 16, 2012, which is incorporated herein by reference in its entirety, and additionally claims priority from German Application No. DE 102011017640.3-52, filed Apr. 27, 2011, which is also incorporated herein by reference in its entirety.

BACKGROUND OF THE INVENTION

Embodiments of the present invention provide a sensor arrangement as it may, for example, be used in combination with Hall sensors. Further embodiments provide a method which may, for example, be used in combination with Hall sensors.

Basically, the offset of a sensor and that of a subsequent amplifier are determined or compensated separately from the useful signal, as otherwise an unknown value of the measurement is overlaid which is at best constant but mostly depends on the temperature. In the measurement of very small signals, the offset signal may well be a magnitude above the useful signal. So that stochastic interference signals existing in further processing have little influence on the measurement and remain small as compared to the useful signal, the useful signal is highly amplified directly after the sensor. If the offset signal is too large, however, the amplifier is driven into confinement by this offset signal and the useful signal can no longer reach the subsequent processing chain. In the following, some concepts for offset compensation are to be presented.

1. Offset compensation by addition/subtraction of a digitally controlled signal after the amplifier.

There are circuits which first of all amplify the signal a little in order to then subtract a correction voltage. Then, a further amplifier stage follows. The sensor signal is not deteriorated before amplification. By the overload conditioned by the offset only small amplifications are possible.

A somewhat better method is illustrated by DE 10 2004 010 362 B4 or by DE 10 2009 006 546 A1. An amplifier having a current output is illustrated whose output current is summed up with a current from a digitally tracked DAC. The compensation is independent of the internal resistance of the sensor but the problem of the possible overload with a small sensor signal remains. Current circuits do have a higher dynamic range that voltage circuits, but this procedure is not optimal in particular with high amplifications. Apart from that, current outputs are usually not as linear and, in the amplification factor, not as temperature-stable as voltage outputs.

A very high amplification of a sensor signal is not possible in this way.

2. Offset compensation by addition or subtraction of a digitally controlled signal before the amplifier.

US 2003/0178989A1 shows the application of a summator circuit before the amplifier. By this, the amplifier can no longer be overdriven or overloaded by the offset. The adder circuit is, however, located in the noise- and distortion-sensitive part of the circuit, and is thus the main source for stochastic interferences and non-linear distortion. A highly accurate system cannot be acquired in this way.

3. Offset compensation in the sensor by a determined feed of a temperature-dependent current.

EP 0525235 describes how a compensation current is realized, depending on the temperature, with constant and settable linear and square portions which are set once upon manufacturing for each sensor system. In this example, this serves to shift the time of a comparator downstream from the sensor by a very large but temperature-constant amount as not the sensor, but a continuously existing external magnetic field is to trigger a switchover only when exceeding this amount. Influences on the offset of the sensor beyond this temperature remain uncompensated like, for example, the change of the temperature characteristic over time.

The necessity for calibration with different temperatures is time-consuming and expensive.

SUMMARY

According to an embodiment, a sensor arrangement may have a current regulator; a reference resistance; a feed current scaler; and a sensor element having an internal resistance, wherein the internal resistance of the sensor element and the reference resistance have a predetermined ratio with respect to each other; wherein the current regulator is implemented to provide a reference current by the reference resistance and, in response to an interference influence-conditioned change of the reference resistance, change the reference current such that the voltage decreasing across the reference resistance remains in a predetermined range around an applied set voltage; wherein the current regulator is further implemented to provide a feed current to the feed current scaler and to change a magnitude of the feed current depending on a magnitude of the reference current; and wherein the feed current scaler is implemented, based on the feed current, to supply a scaled feed current into the sensor element to scale a voltage decreasing across the internal resistance of the sensor element according to the scaling of the feed current.

According to another embodiment, a sensor arrangement may have a voltage regulator; a feed current scaler; and a sensor element having an internal resistance; wherein the voltage regulator is implemented to set a supply voltage for the sensor element and, in response to an interference influence-conditioned change of the internal resistance of the sensor element, to change a supply current of the sensor element such that the supply voltage for the sensor element remains in a predetermined range; wherein the voltage regulator is further implemented to provide a feed current to the feed current scaler and to change this feed current depending on the change of the supply current for the sensor element; and wherein the feed current scaler is implemented, based on the feed current, to supply a scaled feed current into the sensor element, to scale a voltage decreasing across the internal resistance of the sensor element according to the scaling of the feed current.

According to another embodiment, a method in a sensor arrangement with a sensor element having an internal resistance may have the steps of providing a reference current by a reference resistance; providing a feed current; changing the reference current in response to an interference influence-conditioned change of the internal resistance of the sensor element such that a voltage decreasing across the reference resistance remains in a predetermined range around an applied set voltage; changing a magnitude of the feed current depending on a magnitude of the reference current; and feeding a scaled feed current based on the feed current into the sensor element to scale a voltage decreasing across the internal resistance of the sensor element according to the scaling of the feed current; wherein the reference resistance and the internal resistance have a predetermined ratio with respect to each other.

According to another embodiment, a method in a sensor arrangement with a sensor element having an internal resistance may have the steps of setting a supply voltage for the sensor element; providing a feed current; changing a supply current for the sensor element in response to an interference influence-conditioned change of the internal resistance of the sensor element so that the supply voltage for the sensor element remains within a predetermined range; changing the feed current depending on the change of the supply current for the sensor element; and feeding a scaled feed current based on the feed current into the sensor element to scale a voltage decreasing across the internal resistance of the sensor element according to the scaling of the feed current.

Some embodiments of the present invention provide a sensor arrangement having a current regulator, a reference resistance, a feed current scaler and a sensor element having an internal resistance. The internal resistance of the sensor element and the reference resistance comprise a predefined ratio. The current regulator is implemented to provide a reference current by the reference resistance and, in response to an interference effect-conditioned change of the reference resistance, change the reference current such that the voltage decreasing across the reference resistance remains in a predefined range around an applied set voltage. Further, the current regulator is implemented to provide a feed current to the feed current scaling means and to change an amount of the feed current depending on an amount of the reference current. The feed current scaling means is implemented, based on the feed current, to feed a scaled feed current into the sensor element, to scale a voltage decreasing across the internal resistance of the sensor element according to the scaling of the feed current. In other words, the feed current scaling means scales the scalable feed current which also results in a scaling of the voltage decreasing across the internal resistance of the sensor element.

It is an idea that a sensor arrangement may be created which is more insensitive to interference influences than the sensor arrangements described in the introductory part of this document when a feed current is fed into a sensor element of such a sensor arrangement which generates a voltage in the sensor element which is changed depending on the change of a reference current by a reference resistance. This feed current may, for example, be used to reduce the effects of interference influence-conditioned changes in the sensor element. Due to the change of the feed current into the sensor element and thus the voltage decreasing in the sensor element depending on the change of the reference current, it is enabled that, in response to a change of the interference influence detected with respect to the change of the voltage decreasing across the reference resistance, also the feed current is changed. This will happen in such a way that the voltage decreasing by the feed current across the internal resistance of the sensor element is scalable with respect to the applied set voltage, but remains virtually unchanged by the interference influence. By this, an interference influence-dependent regulation of the voltage decreasing across the internal resistance of the sensor element is enabled.

Some further embodiments provide a sensor arrangement having a voltage regulator, a feed current scaling means and a sensor element having an internal resistance. The voltage regulator is implemented to set a supply voltage for the sensor element and, in response to an interference influence-conditioned change of the internal resistance of the sensor element, to change a supply current of the sensor element so that the supply voltage for the sensor element remains in a predetermined range. The voltage regulator is further implemented to provide a feed current to the feed current scaling means and to change this feed current depending on the change of the supply current for the sensor element. The feed current scaling means is implemented, based on the feed current, to feed a scaled feed current into the sensor element to scale a voltage decreasing across the internal resistance of the sensor element according to the scaling of the feed current.

It is one idea of these further embodiments that a sensor arrangement may be provided which is more resistant to interference influences than sensor arrangements as described in the introductory part if a (scaled) feed current is fed into a sensor element of such a sensor arrangement which is changed depending on a change of the supply current for the sensor element. In the sensor element, the feed current fed into the sensor element generates a voltage which, for example, counteracts an offset. As the magnitude of the offsets to be balanced is, however, stochastically distributed, the offset is counteracted by a suitable scaling of the voltage decreasing in the sensor due to the feed current. From the internal resistance of the sensor changed by interference influences, a supply current follows for the same voltage decrease, readjusted according to the interference influence change. Embodiments thus utilize the change of the feed current for the sensor element as a reference for a change of the feed current and thus need no additional components to detect a change of the internal resistance of the sensor element in order to then adapt the feed current accordingly. With a sensor element, a supply voltage of the sensor element may be held constant by adapting the supply current in order to operate the sensor element in its optimum operating range. This keeping constant of the supply voltage is here effected by regulating the supply current for the sensor element.

Embodiments here utilize the change of the supply current (which serves to keep the supply voltage constant for the sensor element) caused by an interference influence of the internal resistance, as a basis for the change of the feed current, in order to account for the changes of the interference influences also with respect to the voltage decreasing in the sensor element due to the feed current.

It is one advantage of these embodiments that the supply current for the sensor element itself serves as a reference for setting the feed current, which may, for example, serve for reducing offsets, and may thus guarantee a precise setting of the feed current in response to changes of the interference influences.

The supply voltage may, for example, be the voltage applied between two feeding voltage terminals of the sensor element, for example between a supply terminal for feeding the supply current and a base or foot point terminal of the sensor element.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
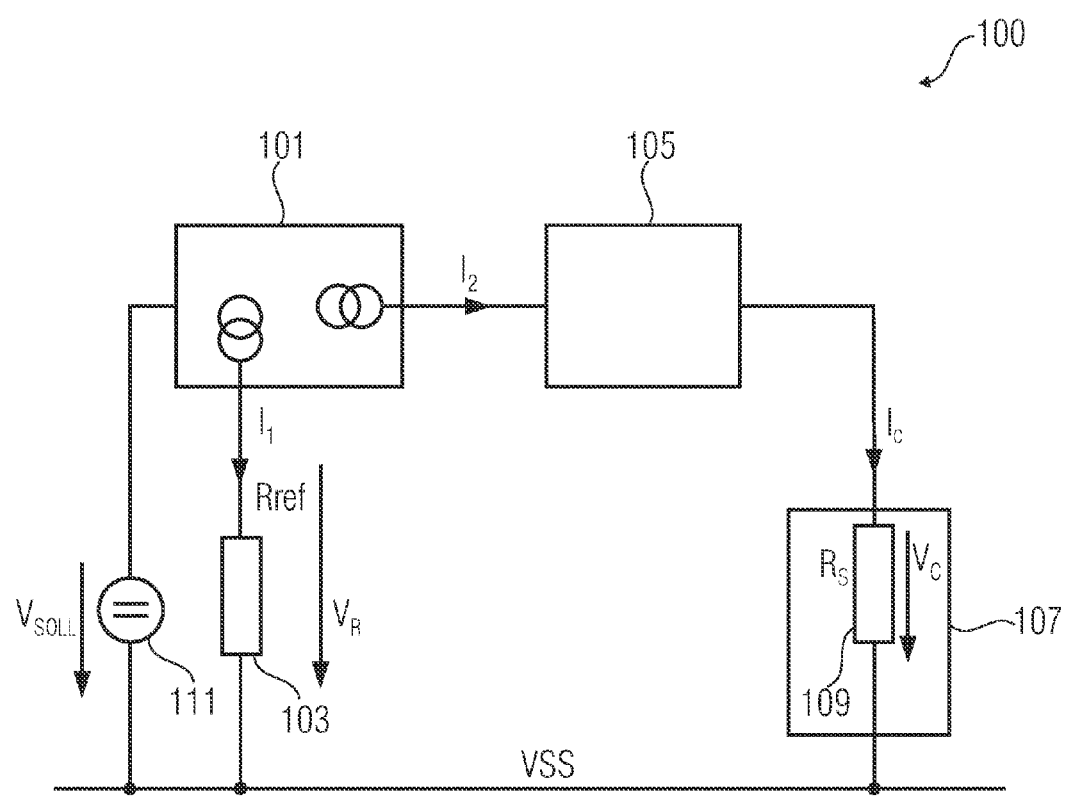
FIG. 1 is a block diagram of a sensor arrangement according to one embodiment.

Before embodiments of the present invention are described in the following with reference to the accompanying drawings, it is to be noted that like elements or elements of the same function are provided with the same reference numerals and that a repeated description of those elements is omitted. Descriptions of elements having the same reference numerals are thus mutually interchangeable.

FIG. 1 shows a block diagram of a sensor arrangement 100 according to one embodiment of the present invention.

The sensor arrangement 100 comprises a current regulator 101, a reference resistance 103 (also referred to as Rref), a feed current scaling means 105 and a sensor element 107 having an internal resistance 109 (also referred to as Rs).

The internal resistance 109 of the sensor element 107 and the reference resistance 103 comprise a given ratio with respect to each other.

The current regulator 101 is implemented to provide a reference current by the reference resistance 103 to change the reference current in response to an interference influence-conditioned change of the reference resistance 103 so that the voltage VR decreasing across the reference resistance remains in a predetermined range around an applied set voltage Vsoll.

Further, the current regulator 101 is implemented to provide a feed current I2 to the feed current scaling means 105 to change an amount or magnitude of the feed current I2 depending on a magnitude of the reference current I1.

The feed current scaling means 105 is implemented, based on the feed current, to feed a scaled feed current Ic into the sensor element 107 to scale a voltage Vc decreasing across the internal resistance 109 of the sensor element 107 according to the scaling of the feed current I2.

The voltage Vc decreasing across the internal resistance 109 of the sensor element 107 may, for example, counteract an offset of the sensor element 107. In other words, in the sensor element 107, using the scaled feed current Ic the voltage Vc may be generated which counteracts an offset of the sensor arrangement 107. Due to the fact that the feed current I2 is changed depending on a change of the reference current I1, and due to the predetermined ratio between the reference resistance 103 and the internal resistance 109, interference influence-conditioned changes of the internal resistance 109 which would lead to a change of the voltage Vc decreasing across the internal resistance 109 when the feed current I2 is kept constant, may at least balanced to a certain degree. In this way it may, for example, be enabled that the voltage Vc decreasing across the internal resistance 109 is (virtually) independent of interference influences due to the change of the feed current I2. For example, the current regulator 101 may provide the feed current I2 so that the voltage Vc decreasing across the internal resistance 109 (despite a change of the interference influences) remains in a predetermined range (for example±10% of a set value). Interference influences may, for example, be temperature or age.

For example, the feed current scaling means 105 may scale the feed current depending on an output signal of the sensor arrangement 100.

According to further embodiments, the feed current scaling means may also comprise calibration values, based on which it scales the feed current I2, for example to reduce a sensor offset of the sensor element 107.

According to further embodiments, the sensor arrangement 100 may further comprise an interference influence-independent reference voltage source 111 for generating the set voltage Vsoll. For example, the interference influence-independent reference voltage source 111 may be a temperature-stable reference voltage source.

Figure 2:
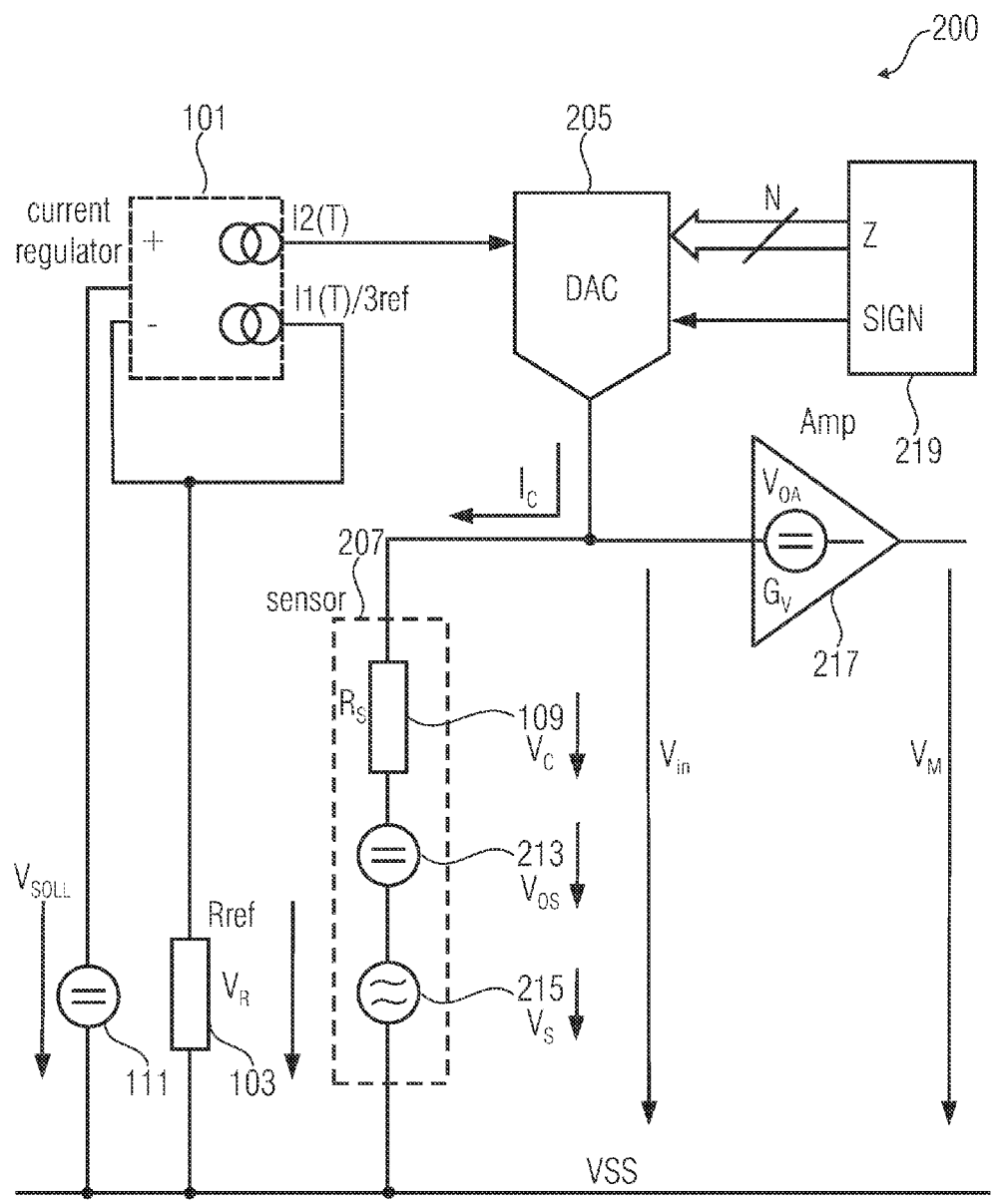
FIG. 2 is a block diagram of a sensor arrangement according to a further embodiment.

FIG. 2 shows a sensor arrangement 200 according to a further embodiment. The sensor arrangement 200 is different from the sensor arrangement 200 illustrated in FIG. 1 as the scaling means 105 is implemented as a DAC 205 (DAC=digital to analog converter). Further, in FIG. 2 a real sensor element 207 (also referred to as sensor 207) is illustrated which comprises an offset source 213 and a sensor voltage source 215 in addition to the internal resistance 109. Further, the sensor arrangement 200 comprises an output amplifier 217 (also referred to as AMP).

With the sensor arrangement 200 illustrated in FIG. 2, the signal of the sensor element 207, i.e. the sensor voltage Vs, is to be evaluated. The equivalent circuit diagram of the sensor 202 illustrated in FIG. 2 shows the internal resistance 109 (Rs), the useful voltage signal Vs (which is to be evaluated) and the unwanted offset voltage signal VOS. The voltage Vin applied to the input of the output amplifier 217 is amplified by the amplifier 217 by the factor Gv and output as the signal VM (for example in the form of a current or a voltage) for further processing.

It is desired for certain reasons to amplify $V_S$ as strongly as possible, i.e. to select Gv to be as large as possible. Here, the offset voltage of the sensor 207 VOS and of the amplifier 217 VOA are obstructive, as the same are also amplified. In particular with offset voltages which are very high as compared to the useful voltage (VS), the amplifier 217 is over-modulated at the output by the amplification of the offset voltages VOS, VOA. Nothing more may be seen of the useful signal (VS) at the output of the amplifier 217 then.

Thus, for the compensation of the offset voltages OS, VS, the scaled feed current or compensation current Ic is fed into the sensor 207. This scaled feed current Ic may be set by the feed current scaling means 205 so that it generates the voltage Vc at the internal resistance 109 of the sensor 207, wherein the voltage counteracts the offset voltages and thus compensates or at least reduces the same.

The embodiment illustrated in FIG. 2 thus enables balancing or at least reducing a sensor offset together with an amplifier offset. The scaled feed current Ic which is fed into the sensor element 207 is temperature-dependent and may be digitally readjusted with the help of the feed current scaling means 205.

For example, the current regulator 101 may control the reference current I1 (T) such that the voltage VR generated by the same at the reference resistance 103 corresponds to the reference voltage Vsoll at least within a tolerance range.

The tolerance range may, for example, be ±10%, ±5%, ±1% of the reference voltage Vsoll.

The interference influence may, for example, be the temperature T.

The reference current I1 (T) thus depends on the temperature T. The (feed) current I2 (T) is dependent on the same (for example proportional to the same). The same is weighted in the DAC 205 by a regulator value Z and a sign SIGN and for example fed into the sensor 207 as the compensation current Ic.

According to further embodiments, the sensor arrangement 200 may comprise a digital regulator 219. This overlaid digital regulator 219, using a predetermined algorithm, for example from the output signal VM digitized with the resolution of M bits (with M≥1), may determine the digital setting or control value Z and the sign SIGN. The overlaid (digital) regulator 219 sets the voltage Vc at the sensor with the digital value Z, although the method uses a current (the scaled feed current Ic) through an unknown resistance RS. For the user this means that he may infer the magnitude of the offset sum directly from the regulator value Z or vice versa may infer an optimum correction value directly from the known offset voltage.

The value for the digital tracking is independent of the temperature and thus the loop amplification for the overlaid digital regulator 219 is constant, which offers an advantage for the robustness of the system. The digital regulator 219 may be implemented substantially faster. In the optimum case, in one step the optimum correction value may be set.

The digital readjustment or post-regulation itself still guarantees a secure compensation of the offset even with a change of the characteristics of the offset over temperature and with additional influences which have an offset effect.

The settable source may be controlled with less effort. In particular, the number of needed digital stages is clearly reduced.

In summary, embodiments provide a sensor arrangement wherein a sensor and an amplifier offset voltage are corrected.

The reference for the maximum magnitude of the voltage signal Vc at the sensor is a temperature-constant reference voltage Vsoll.

A means for generating the correction is a feed current Ic.

The generation of the compensation signal Vc is done directly in the sensor without a further means in the signal path by a linear overlaying of the sensor voltage with a voltage Vc generated by this current Ic at the internal sensor resistance 109.

The maximum value of the current I2 is regulated across the temperature so that in the sensor a voltage Vc results which is constant across the temperature.

In order to adapt the value to the randomly distributed and temporally variant values of the sensor offset voltage VOS and the amplifier offset voltage VOA—depending on a digital control signal (Z, SIGN)—only a portion of the maximum value of the current I2 may be conducted into the sensor (the scaled feed current Ic). From this, a proportionately smaller correction voltage which is also constant over temperature results.

The setting of the digital control value Z, SIGN may be done via the upstream digital regulator 219.

The regulator range and resolution of the settable circuit remain manageable, as the temperature decrease of the internal sensor resistance is considered by the current scaling, so that it is sufficient according to further embodiments if the circuit only covers the temperature decrease or the drifts of the offsets and the deviation of the temperature range of the internal sensor resistance from an expected value.

Embodiments may, for example, be used in a spinning current system.

Figure 3:
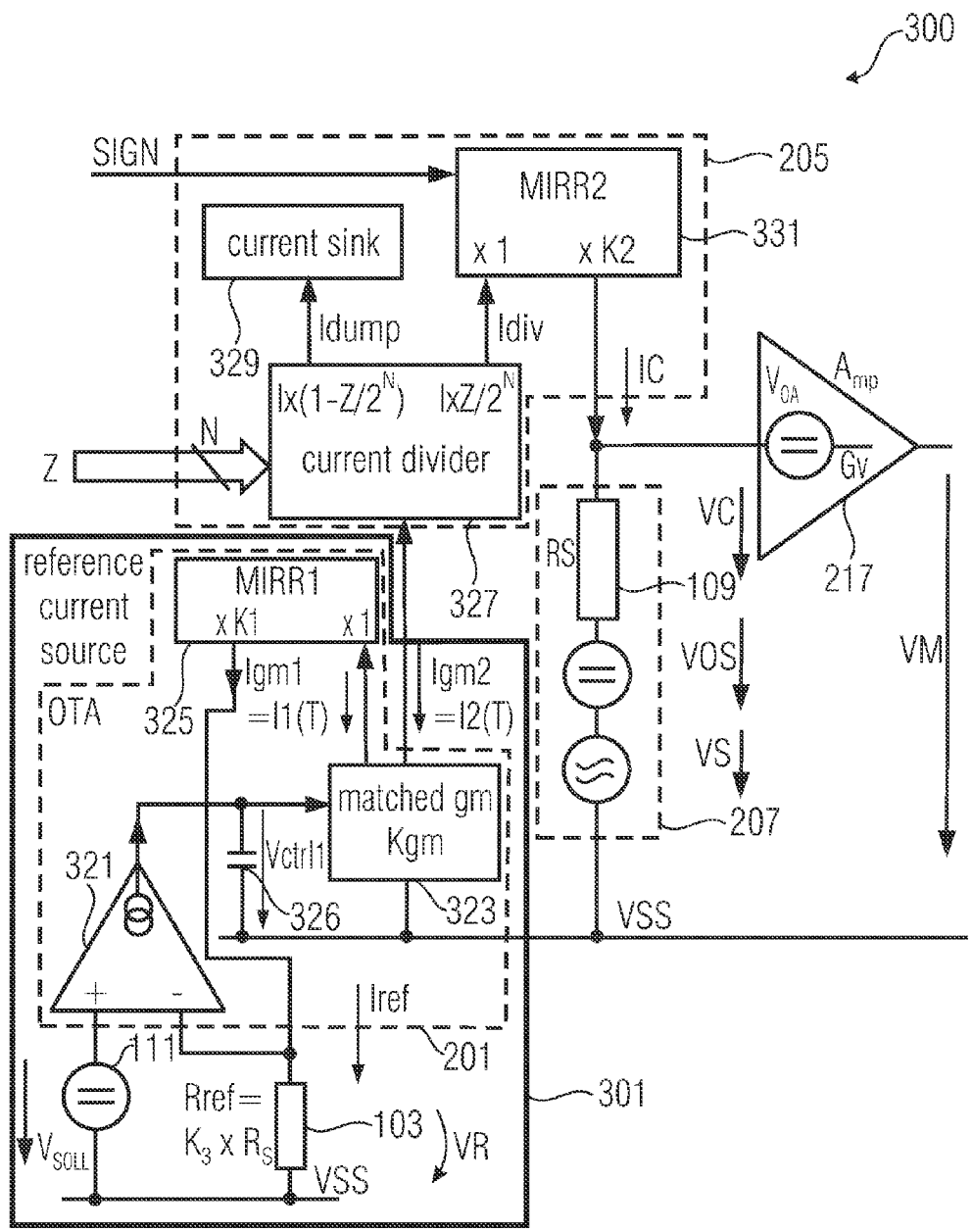
FIG. 3 is a block diagram of a sensor arrangement according to a further embodiment.

FIG. 3 shows a sensor arrangement 300 according to a further embodiment of the present invention. The sensor arrangement 300 is different from the sensor arrangement 200 illustrated in FIG. 2 in that one possible implementation of the DAC 205 or the feed current scaler 205 is illustrated. Further, the sensor arrangement 300 comprises a reference current source 301 which includes the reference resistance 103 and the temperature-stable reference voltage source 111 and the current regulator 201. In addition, one possible implementation of the current regulator is illustrated.

The reference resistance 103 may be implemented such that certain interference influences cause the changes of the internal resistance 109 of the sensor element 207, change the magnitude of the reference resistance 103 correspondingly so that the voltage VC decreasing across the internal resistance 109 of the sensor element 207 remains within a tolerance range independent of these interference influences.

In this way, for example, the reference resistance 103 may be subjected to the same interference influences as the internal resistance 109 of the sensor element 207. For example, the reference resistance 103 and the internal resistance 109 may have been manufactured on the same substrate and, for example, in the same semiconductor process.

In one embodiment, the characteristic of the feed current I2 (T) over the temperature T is inferred from the reference resistance 103 of the same material and accordingly scaled geometry as the internal sensor resistance 109.

In other words, a material of the reference resistance 103 and a material of the internal resistance 109, within a tolerance range, may comprise the same performance with respect to an interference influence such that a change of the reference resistance 103 caused by such an interference influence causes a unidirectional change of the internal resistance 109 of the sensor element 207 scaled according to the ratio between the reference resistance 103 and the internal resistance 109.

The tolerance range may here, for example, be very small when the same material is selected for the reference resistance 103 and the internal resistance 109.

According to further embodiments, also a similar material may be selected for the two resistors 103 and 109. Here, the tolerance range may, for example, be selected such that a temperature coefficient of the material of the internal resistance 109 deviates from a temperature coefficient of the material of the reference resistance 103 by a maximum of ±20%, ±10%, ±5% or ±1%.

Further, dimensions of the reference resistance 103 may scale according to the ratio between the reference resistance 103 and the internal resistance 109 of the sensor element 107 with dimensions of the internal resistance 109 of the sensor element 207.

Thus, for example, a resistance value of the internal resistance 109 of the sensor element 207 may be unknown, the dimensions of the internal resistance 109 may be known, however, so that dimensions of the reference resistance 103 are selected according to a scaling ratio K3 between the reference resistance 103 and the internal resistance 109. If now also the material of the reference resistance 103 is selected to be equal to the material of the internal resistance 109, and if these two resistances are manufactured in a common semiconductor process, then it may be guaranteed, although the resistance value of the internal resistance 109 is unknown, that at least the ratio K3 between the reference resistance 103 and the internal resistance 109 is correct. The reference resistance 103 thus forms a so-called replica resistance of the internal resistance 109 with the scaling ratio K3.

It may thus, for example, be enabled that a resistance value of the reference resistance 103 experiences a temperature-conditioned change of the internal resistance 109 of the sensor element 207 according to the ratio between the reference resistance 103 and the internal resistance 109.

The current regulator 201 comprises a regulating amplifier 321 (also referred to as OTA) and a current provider. In the embodiment illustrated in FIG. 3, the current provider comprises a gm stage 323 and an optional first current mirror 325

(MIRR1). The feed current I2 (T) in its maximum magnitude is generated in the gm stage 323 and by branching a portion (in the DAC 205) the low-noise scaled feed current Ic is generated which may balance the offset. Every increase of the resolution adds a smaller current which is low-noise per se. The maximum current I2 (T) remains unchanged, however, regarding noise characteristics.

Further, the feed current scaler 205 comprises a current divider 327, a current sink 329 and a second current mirror 331 (also referred to as MIRR2).

In the following, the functioning of the sensor arrangement illustrated in FIG. 3 is to be explained in detail.

The regulating circuit with OTA, gm stage (voltage Vctrl1 to current Igm1 and Igm2 converter), $1^{st}$ current mirror MIRR1 and reference resistance Rref regulates Iref such that the voltage at the reference resistance corresponds to the reference voltage Vsoll within a tolerance range.

The output currents Igm2 and Igm1 are connected to each other by the factor Kgm as they are controlled by the same Vctrl1:

$$Igm2/Igm1=Kgm \qquad (1)$$

Kgm ought to be close to 1 in order to acquire a good matching (and high correlation) between the two currents.

In the current mirror 325, the current Igm1 is translated into the current Iref with the factor 1/K1. The current Igm2 which depends on the temperature T is thus proportional to the current Iref by the reference resistance:

$$Igm2(T)=Iref(T)*Kgm/K1 \qquad (2)$$

If the matched gm stage 323 is switched against positive feeding VDD, the mirror MIRR1 may be omitted. K1 is then set to 1.

In the current divider, part of the current Idump is branched and guided into the current sink which provides a good termination of the current divider output Idump. The ratio Idiv/Igm2 is set with the N bit-wide binary signal Z.

$$Idiv(T)=Iref(T)*Z/2^N*Kgm/K1; Z=[0,1,\ldots,2^N-1] \qquad (3)$$

The second current mirror MIRR2 with a mirror ratio K2, which again ought to be close to 1, conducts the rest of the current Idiv with the correct sign as Ic to the sensor. The sign is set using the binary signal SIGN.

$$Ic(T)=+/-Iref(T)*K2*Z/2^N*Kgm/K1 \qquad (4)$$

As Iref is regulated such that the voltage at Rref corresponds to the reference voltage Vsoll, the following applies:

$$Iref(T)=Vsoll/(Rs(T)*K3) \qquad (5)$$

and thus $$Vc = Rs(T)*Ic(T) \qquad (6)$$
$$= +/-Rs(T)*Iref(T)*K2*Z/2^N*Kgm/K1$$
$$= +/-Rs(T)*(VRef/(Rs(T)*K3))*K2*Z/2^N*Kgm/K1$$

Here, Rs(T) is cancelled down again and the voltage Vc generated in the sensor is again independent of the internal sensor resistance and thus also of its temperature range:

$$Vc=+/-(VRef/K3)*K2*(Z/2^N)*(Kgm/K1) \qquad (7)$$

The setting resolution $\Delta Vc$ is:

$$\Delta Vc=(Vsoll/K3)*K2*(1/2^N)*(Kgm/K1) \qquad (8)$$

Using the setting $$Vc(T)=(-\frac{1}{2}\ldots+\frac{1}{2})*\Delta Vc-[Vos(T)+Voa(T)] \qquad (9)$$

only the useful portion and a residual of the offset remain. The output voltage then is $$Vout = Gv*Vs + Gv*(-1/2\ldots+1/2)*\Delta Vc \qquad (10)$$
$$= Gv*Vs + Gv*(-1/2\ldots+1/2)*(Vsoll/K3)*K2*$$
$$(1/2^N)*(Kgm/K1).$$

K1, K2, K3 and Kgm may be selected close to 1 (for example greater than 0.9 and smaller than 1.1), as $\frac{1}{2}^N$ determines the resolution.

The circuit is low-noise and enables high amplifications Gv by a small setting resolution $\Delta Vc$.

In summary, the sensor arrangement 300 in FIG. 3 shows a sensor arrangement with a temperature-stable reference voltage source 111 for generating the set voltage Vsoll. The current regulator 205 is implemented to regulate the reference current Iref (also referred to as I1) such that the voltage VR at the reference resistance 103 corresponds to the set voltage Vsoll within a predetermined tolerance range. For example, the reference voltage VR may be selected such that it deviates from the set voltage Vsoll by a maximum of ±10%, ±5%, ±1%.

At the capacitor 326 the current output signal of the OTA 321 is summed up and the voltage Vctrl1 results which describes an integral value of the deviation of the voltage VR decreasing across the reference resistance 103 from the set voltage Vsoll. The current provider (the matched gm stage 323 in connection with the first current mirror 325) is implemented to provide the reference current Iref and the feed current I2 based on the differential signal such that the feed current I2 is proportional to the reference current Iref.

The current regulator 205 and the reference resistance 103 may be implemented to execute the change of the feed current I2 depending on the change of the reference current I1 such that with the interference influence-conditioned change of the reference resistance 103 and an accompanying interference influence-conditioned change of the internal resistance 109 of the sensor element 207 the voltage Vc decreasing across the internal resistance 109 remains within a predetermined range (for example constant).

Thus, for example, a change of the internal resistance 109 due to changed interference influences may be counteracted, so that despite the changed interference influences the voltage across the internal resistance 109 remains constant, for example to reduce or compensate the amplifier offset VOA and the sensor offset VOS.

For example, the voltage Vc decreasing across the internal resistance 109 may be selected such that it corresponds to at least 80%, 90%, 95% of the sum of the sensor offset Vos and the amplifier offset Voa and has a sign opposite to that of the sum.

In other words, the sensor arrangement 200 may be implemented to generate the voltage Vc decreasing across the internal resistance 109 of the sensor element 207 such that the same counteracts an offset portion in an output signal VM of the sensor arrangement (for example at an output of the output amplifier 217).

For example, the current regulator 101 may be implemented to change the magnitude of the feed current I2 proportional to the magnitude of the reference current I1 in a ratio which results from the ratio between the reference resistance 103 and the internal resistance 109 of the sensor element 207 and from a ratio between the set voltage Vsoll and a voltage Vc across the internal resistance 109 decreasing with no or a minimal scaling of the feed current I2. A minimum scaling here is to indicate that the feed current scaler 205 passes on the received feed current I2 directly to the sensor element 207 without scaling the same.

Figure 4:
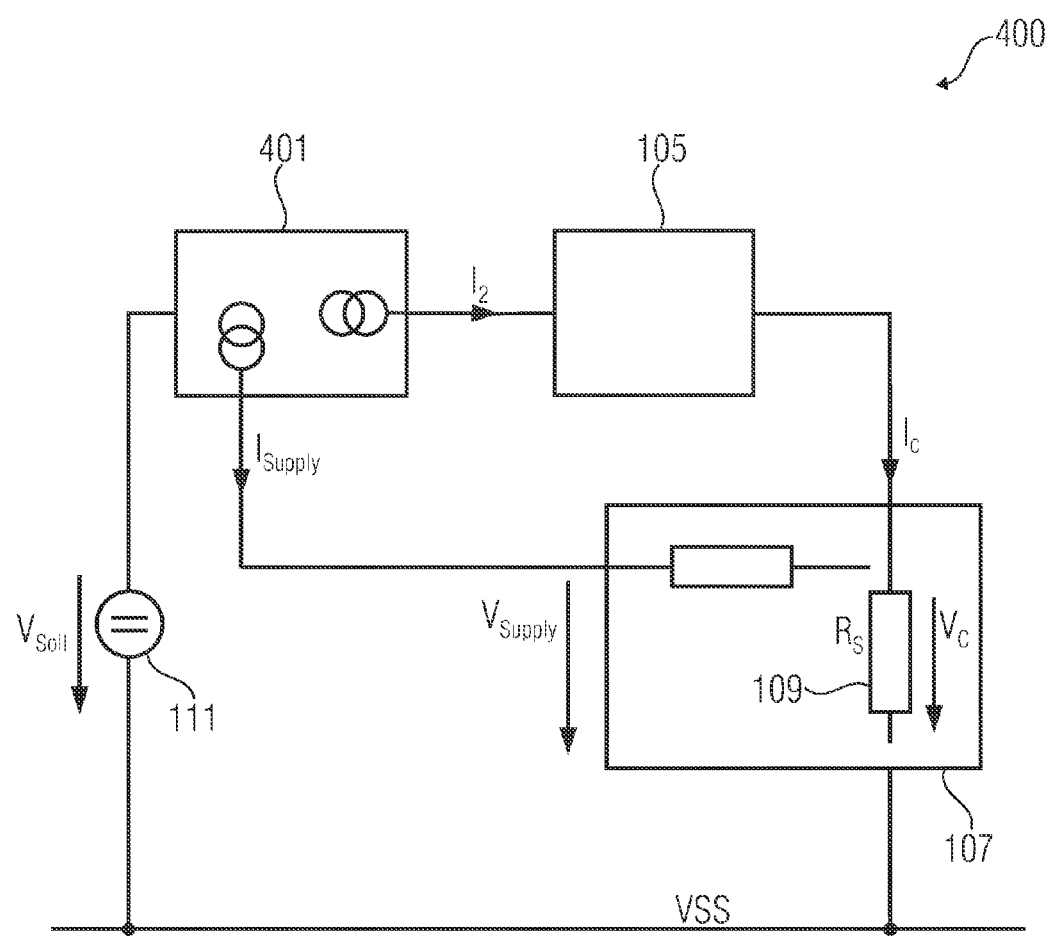
FIG. 4 is a block diagram of a sensor arrangement according to a further embodiment.

FIG. 4 shows a sensor arrangement 400 according to a further embodiment of the present invention.

The sensor arrangement 400 comprises a voltage regulator 401, a feed current scaler 105 and a sensor element 107 with an internal resistance 109 (also referred to as Rs) as part of a sensor equivalent circuit which may be modeled as a network with resistive portions.

The voltage regulator 401 is implemented to set a supply voltage Vssupply for the sensor element 107, and in response to an interference influence-conditioned change of the internal resistance 109 of the sensor element 107, change a supply current Isupply of the sensor element 107 such that the supply voltage Vssupply for the sensor element 107 remains within a predetermined range (for example constant within a tolerance range).

The voltage regulator 401 is further implemented to provide a feed current I2 to the feed current scaler 105 and to change the feed current I2 depending on the change of the supply current Isupply for the sensor element 107.

The feed current scaler 105 is implemented to supply a scaled feed current Ic into the sensor element based on the feed current I2 to scale a voltage Vc decreasing across the internal resistance of the sensor element according to the scaling of the feed current I2.

As was already the case in the previous embodiments, the voltage Vc decreasing across the internal resistance 109 of the sensor element 107 due to the scaled feed current Ic may be utilized to reduce an offset of the sensor element 107 (and an amplifier offset), for example to counteract the same. In contrast to the previous embodiments, in the embodiment illustrated in FIG. 4 no reference resistance is needed any more, but the supply current Isupply of the sensor element 107 itself serves as a basis for the setting of the feed current I2. The voltage regulator 401 may thus, based on the change of the supply current Isupply (executed by the voltage regulator 401 to keep the supply voltage Vssupply in the predetermined range), change the current I2 and thus the scaled feed current Ic so that also the voltage Vc decreasing across the internal resistance 109 remains in a predetermined range (for example remains constant within a tolerance range).

According to one embodiment, the voltage regulator 401 may be implemented to set the feed current I2 such that a change of the feed current I2 (at least within a tolerance range) is proportional to a change of the supply current Isupply. The tolerance range may here, for example, be selected such that the change of the feed current I2 deviates maximally by ±10%, ±5% or ±1% from the change of the supply current Isupply.

According to further embodiments, the voltage regulator 401 may also be implemented to set the feed current I2 such that a monotony performance between the feed current I2 and the supply current Isupply is identical, i.e. that the feed current I2 increases when the supply current Isupply increases and the feed current I2 decreases when the supply current Isupply decreases.

Figure 5:
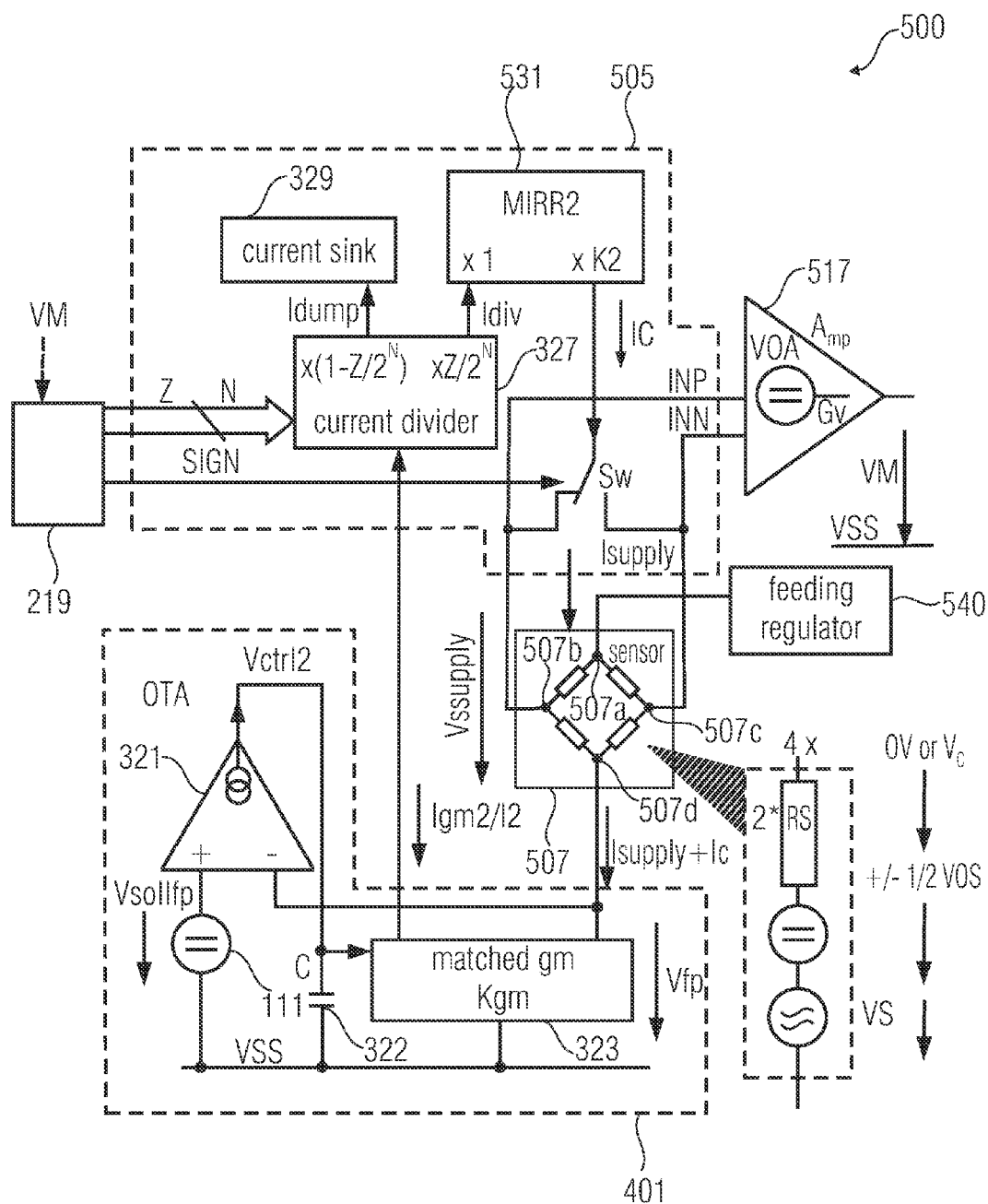
FIG. 5 is a block diagram of a sensor arrangement according to a further embodiment.

FIG. 5 shows a sensor arrangement 500 according to a further embodiment of the present invention. The sensor arrangement 500 illustrated in FIG. 5 is different from the sensor arrangement 400 illustrated in FIG. 4 in that one possible implementation of the voltage regulator 401 is illustrated. In the embodiment illustrated in FIG. 5 the voltage regulator 401 is implemented as a foot point or base regulator 401. Further, FIG. 5 shows one possible implementation of the feed current scaler 105 in the form of a DAC 505 with a sign-dependent selection of the feed point for the scaled feed current Ic into a sensor 507 of the sensor arrangement 500. In the embodiment illustrated in FIG. 5, the sensor 507 is implemented as a sensor in a bridge circuit.

Further, the sensor arrangement 500 comprises an output amplifier 517 (also referred to as Amp) with a differential input.

Further, the sensor arrangement 500 comprises a feeding regulator 540.

As the sensor element 507 is a sensor in a bridge circuit, the equivalent circuit diagram of the sensor element comprises several individual resistors which form, depending on the feed point for the sensor 507, the internal resistance of the sensor element 507 for the respective signal which is fed into this feed point. Ideally, with interference influences all resistances of the sensor 507 in the bridge circuit change unidirectionally.

The foot point regulator 401 is implemented to provide a foot point voltage Vfp at the sensor element 507, to change, in response to the change of the internal resistance of the sensor element 507, the supply current Isupply of the same such that the foot point voltage or foot-point voltage Vfp remains in a predetermined range (for example constant within a tolerance range) and in order to set the feed current I2 (also referred to as Igm2) proportionally with respect to the supply current Isupply within a tolerance range.

The feeding regulator 540 provides a feeding voltage (Vssupply+Vfp) and further acts as a current source for the supply current Isupply. The foot-point regulator 401 acts as a current sink for the supply current Isupply.

The supply voltage Vssupply at the sensor element 507 corresponds to a difference between the sensor voltage (provided by the feeding regulator 540) and the foot-point voltage Vfp.

The foot-point regulator 401 and the feeding regulator 540 in cooperation change the supply current Isupply in case of a change of the internal resistance of the sensor element 507 such that the supply voltage Vssupply for the sensor element remains in the predetermined range. Further, the foot-point regulator 401 is implemented to set the feed current I2 depending on the supply current Isupply and to transfer changes of the supply current Isupply to the feed current I2.

Further, the foot-point regulator 401 and the feeding regulator 540 may be implemented to change the supply current Isupply in response to the change of the internal resistance of the sensor element 507 such that the sensor voltage and the foot-point voltage Vfp remain within ranges predetermined for the same. In other words, the feeding regulator 540 and the foot-point regulator 401 may regulate the voltages which they provide so that the same remain constant, so that a constant voltage Vssupply decreases across the sensor element 507.

As illustrated in FIG. 5, the foot-point regulator 401 may comprise a regulating amplifier 321 with a current output (also referred to as OTA), a capacitor 322 and a current provider 323 (in the form of a matched gm stage). The regulating amplifier 321 is implemented to provide a differential signal VcrI2 which describes a deviation of the foot-point voltage Vfp from a set voltage VsolIfp. The set voltage VsolIfp may, for example, be provided by a temperature-stable reference voltage source 111.

Further, the current provider 232 may be implemented to provide the feed current I2 based on the reference signal VctI2 such that a change of the feed current I2 within a tolerance range is proportional to a change of the supply current Isupply. It is to be noted here that the tolerance range among others results from the fact that the current provider 323, as a basis for the setting of the feed current I2, not only receives the supply current Isupply, but the supply current Isupply plus the scaled feed current Ic.

As illustrated in FIG. 5, further the scaled feed current Ic and the supply current Isupply may be supplied at respectively different terminals of the sensor element 507. Thus, the feeding regulator 540 feeds the supply current Isupply at a first terminal 507a of the sensor element 507. The feed current scaler 505 may optionally feed the scaled feed current Ic (depending on a sign for the scaled feed current Ic) at a second terminal 507b or a third terminal 507c of the sensor element 507. Further, the foot-point regulator 401 may provide the foot-point voltage Vfp at a fourth terminal 507d of the sensor element 507. Further, the sensor arrangement 500 may comprise a scaling regulator 219 (also referred to as a digital regulator) which is implemented to provide a scaling signal to the feed current scaler 505 based on the output signal VM of the sensor arrangement 500. For example, the scaling regulator 219 may provide a digital data word Z to the feed current scaler 505 for scaling the feed current I2 and may further provide a sign signal SIGN which describes a direction of the offset proportion to be compensated in the output signal VM. The feed current scaler 505 is implemented to provide the scaled feed current Ic based on the scaling signal such that the voltage Vc decreasing in the sensor element 507 counteracts an offset proportion in the output signal VM of the sensor arrangement 500. For example, the sensor arrangement 505 may be implemented to select a feed point for the scaled feed current Ic at the sensor element 507 depending on the sign signal SIGN. For example, the feed current scaler 505 may comprise a switch 542 (also referred to as Sw) to feed the scaled feed current Ic depending on the sign signal SIGN either at the second terminal 507b or the third terminal 507c of the sensor element 507.

Further, the second terminal 507b and the third terminal 507c are coupled to a differential input of the output amplifier 517 so that the output signal VM of the output amplifier 517 describes a difference of the signals between those terminals 507b and 507c of the sensor element 507. At those terminals 507b or 507c also the feed current scaler 505 (depending on the sign signal SIGN) impresses the scaled feed current Ic.

In other words, the feed current scaler 505 is implemented to impress the scaled feed current Ic at a terminal 507b, 507c of the sensor element 507 into the sensor element at which also a sensor signal or at least a (differential) part of the sensor signal is provided by the sensor element 507 to reduce an offset (for example the sensor offset VOS and the amplifier offset VOA) existing in the sensor signal.

The feed current scaler 505 may comprise a current divider 327, a current sink 329 and a current mirror 531 (also referred to as MIRR2). The feed current scaler 505 is thus similar to the feed current scaler or the DAC 205, as illustrated in FIG. 3, with the difference that the current mirror 531 needs no sign input as the direction of the scaled feed current Ic is selected by the selection of the feed point at the sensor 507.

In the following, the functioning of the sensor arrangement 500 illustrated in FIG. 5 is to be described in more detail.

If a foot-point regulator exists in the system which regulates the voltage Vfp between the sensor and VSS, the control signal may control a second output stage for the output stage of this control circuit which generates the current Igm2. As the current Isupply needed for setting a constant voltage at Rs depends on Rs (T), a current which is smaller than Isupply by Kgm is the optimum current for generating a compensation voltage Vc at Rs. According to further embodiments, the current may also be deduced from the voltage regulator.

The circuit expenditure needed in addition to the already existing parts becomes less than in the embodiment 300 and the circuit remains low-noise.

The sensor may be a resistive sensor in a bridge circuit or, e.g., a Hall element. Then, the sign of the generated offset with the SIGN signal may simply be realized by switching over the feed point of Ic from INP to INN.

Amp is a differential amplifier which, according to further embodiments, may also have a differential output instead of the unipolar output illustrated in FIG. 5, to which VM is applied against VSS (reference potential, for example mass potential).

The feeding regulator and the foot-point regulator set the voltage at the sensor Vssupply to be constant. Then, the feeding current of the sensor with a branch resistance of 2*Rs is $$I\text{supply}=V\text{ssupply}/(2*Rs(T)) \tag{11}$$

As Isupply is regulated by the regulator proportionally with respect to Igm2, (with Ic=0) the following applies $$Igm2(T)=1/Kgm*V\text{ssupply}/(2*Rs(T)) \tag{12}$$

Here, the current Ic assumed to be small with respect to Isupply is neglected as the result is then changed insignificantly if at this point Isupply+Ic is considered.

$$I\text{div}(T)=1/Kgm*V\text{ssupply}/(2*Rs(T))*Z/2^N; Z=[0,1,\ldots,2^N-1] \tag{13}$$

The second current mirror MIRR2 with a mirror ratio K2, which may again be close to 1, passes on the rest of the current Idiv to the feed switch Sw as Ic. The sign is set using the binary signal SIGN.

$$Ic(T)=+/-K2/Kgm*V\text{ssupply}/(2*Rs(T))*Z/2^N; Z=[0,1,\ldots,2^N-1] \tag{14}$$

At the feed point Ic sees an impedance Rs of the sensor which results from the two resistors of the value 2*Rs connected in parallel or the fed current Ic divides equally into the two partial branches, respectively. The following results:

$$\begin{aligned}Vc &= Rs(T)*Ic(T) \\ &= +/-Rs(T)*K2/Kgm*V\text{ssupply}/(2*Rs(T))*Z/2^N \\ &= +/-K2/Kgm*V\text{ssupply}/2*Z/2^N\end{aligned} \tag{15}$$

Here again Rs(T) is cancelled down and the voltage Vc generated in the sensor is again independent of the internal sensor resistance and thus also of its temperature range. It only depends on the operating voltage of the sensor and the digital regulator value Z. As the offset voltage to be compensated is scaled with the supply voltage of the sensor, this operation is advantageous.

The setting resolution ΔVc is:

$$\Delta Vc=K2/Kgm*V\text{ssupply}/2*\tfrac{1}{2}^N \tag{16}$$

With the setting $$Vc(T)=(-\tfrac{1}{2}\ldots+\tfrac{1}{2})*\Delta Vc-[Vos(T)+Voa(T)] \tag{17}$$

again only the useful portion and a remainder of the offset remain.

The output voltage then is $$Vout = Gv * Vs + Gv * (-1/2 \ldots + 1/2) * \Delta Vc \quad (18)$$
$$= Gv * Vs + Gv * (-1/2 \ldots + 1/2) * K2 / Kgm *$$
$$Vssupply / 2 * 1/2^N$$

K2 may again be close to 1 and then Kgm determines the magnitude of the maximally suppliable signal. The factor $\frac{1}{2}^N$ determines the resolution. The voltage at the sensor is considered automatically.

The circuit is low-noise and enables a high amplification Gv due to a small setting resolution $\Delta Vc$.

According to further embodiments, also the feeding regulator 540 may be implemented to provide the feed current I2, and the foot-point regulator 401 would then no longer have to provide the feed current I2. One advantage would be that the feeding regulator 540, as a basis of the regulation of the feed current I2, no longer comprises the sum of the supply current Isupply and the scaled feed current Ic ((supply+Ic), but only the supply current Isupply, whereby an improved proportionality between the supply current Isupply and the feed current I2 may be acquired.

In other words, the voltage regulator may also be a feeding regulator and may be implemented to provide a sensor voltage at the sensor element 507 and, in response to the change of the internal resistance of the sensor element 507, to change the supply current Isupply of the same such that the sensor voltage Vssupply remains in a predetermined range and to set or provide the feed current I2 proportional to the supply current Isupply within a tolerance range.

Additionally, a foot-point regulator may exist which provides the foot-point voltage Vfp, for example such that the foot-point regulator and the feeding regulator, with a change of the internal resistance of the sensor element, change the supply current Isupply in cooperation such that the supply voltage Vssupply for the sensor element remains within the predetermined range. The feeding regulator may be implemented to set the feed current I2 depending on the supply current Isupply and to transfer changes of the supply current Isupply to the scaled feed current Ic.

In summary, FIG. 5 shows an embodiment with a differential sensor with foot-point regulation.

According to further embodiments, the sensor in bridge circuit illustrated in FIG. 5 may also be used in the sensor arrangements illustrated in FIGS. 1 to 3.

In particular, the system illustrated in FIG. 5 may be used in a so-called spinning current method, in particular with Hall sensors. Thus, the sensor arrangement 505 may, for example, be implemented to provide the scaled feed current Ic in temporal sequence at each of the four terminals 507a to 507d of the sensor element 507 to reduce the offset portion in the output signal VM of the sensor arrangement 500 in every measurement with the sensor element 407.

In the following, some aspects of embodiments are to be summarized.

Embodiments enable a rendering of sensor signals of offset-loaded sensors also with an internal ohmic resistance. The arrangement may be implemented such that the limiting factor of the measurement value detection is only the stochastic interferences of the sensor itself and that, using embodiments of the present invention, an exact and low-noise compensation of the offset of the sensor and amplifier may be acquired even before the amplifier.

In contrast to the above-mentioned method of offset compensation by addition/subtraction of a digitally regulated signal after the amplifier, embodiments need no compensation means at the output as the compensation acquires the desired result at the input.

In contrast to the above-mentioned concepts with an offset compensation by addition or subtraction of a digitally regulated signal before the amplifier, in embodiments of the present invention the compensation signal is generated directly within the sensor and thus needs no summator circuit. The sensor signal thus remains virtually uninfluenced.

In contrast to the above-mentioned concepts of offset compensation in the sensor by a determined feed of a temperature-dependent current, in embodiments a temperature-dependent and digitally corrected current for offset compensation is supplied.

The sensor elements or the sensors illustrated in FIGS. 1 to 5 may, for example, be Hall sensors, for example in a bridge circuit.

Figure 6:
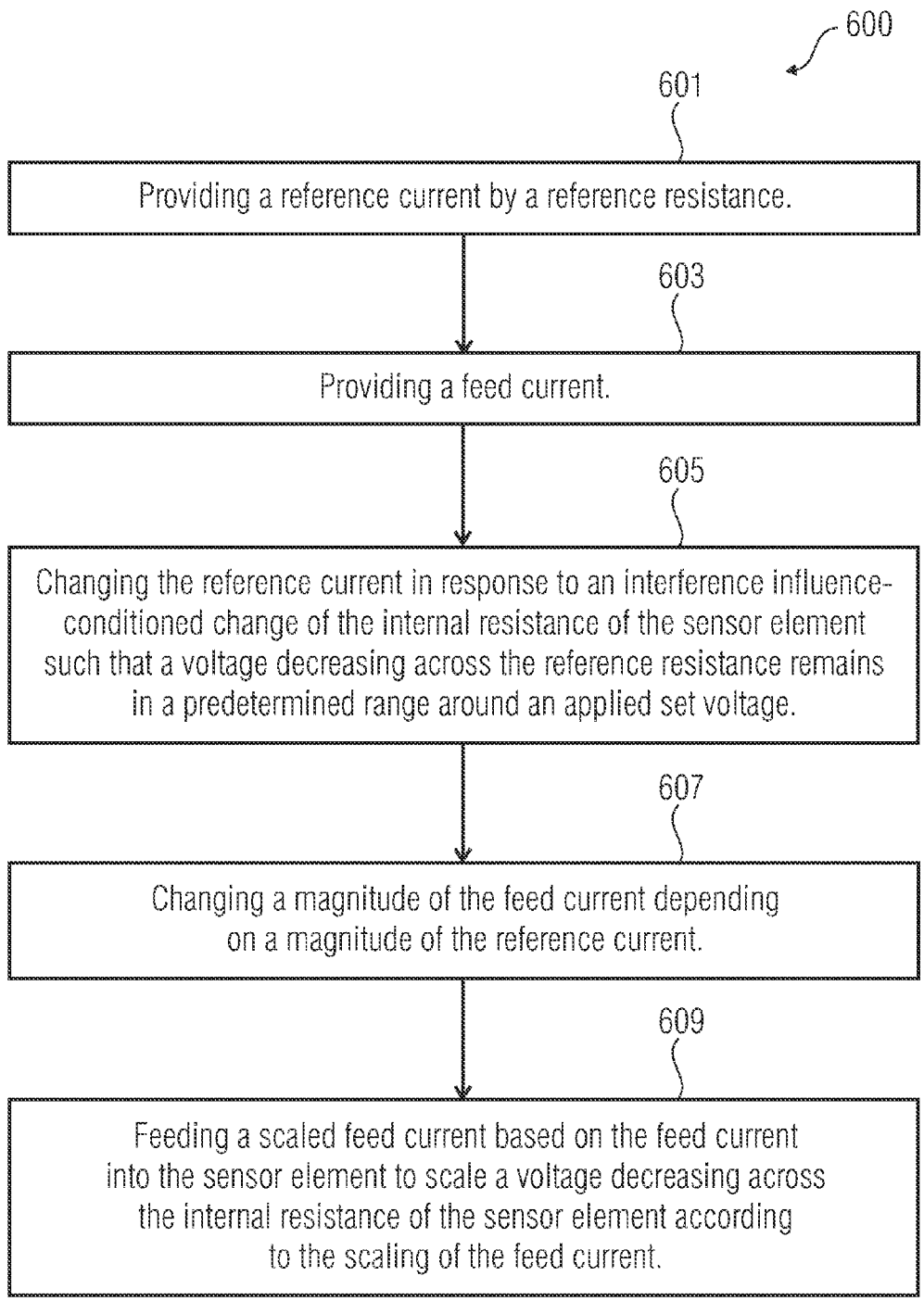
FIG. 6 is a flowchart of a method according to one embodiment.

FIG. 6 shows a method 600 in a sensor arrangement with a sensor element which comprises an internal resistance.

The method 600 comprises a step 601 of providing a reference current by a reference resistance.

Further, the method 600 comprises a step 603 of providing a feed current.

Further, the method 600 includes a step 605 of changing the reference current in response to an interference influence-conditioned change of the internal resistance of the sensor element such that a voltage decreasing across the reference resistance remains in a predetermined range around an applied set voltage.

Further, the method 600 comprises a step 607 of changing a magnitude of the feed current depending on a magnitude of the reference current.

Further, the method 600 includes a step 609 of supplying a scaled feed current based on the feed current into the sensor element to scale a voltage decreasing across the internal resistance of the sensor element according to the scaling of the feed current. The reference resistance and the internal resistance here comprise a predetermined ratio with respect to each other.

The method 600 may, for example, be executed using one of the sensor arrangements 100-300.

Figure 7:
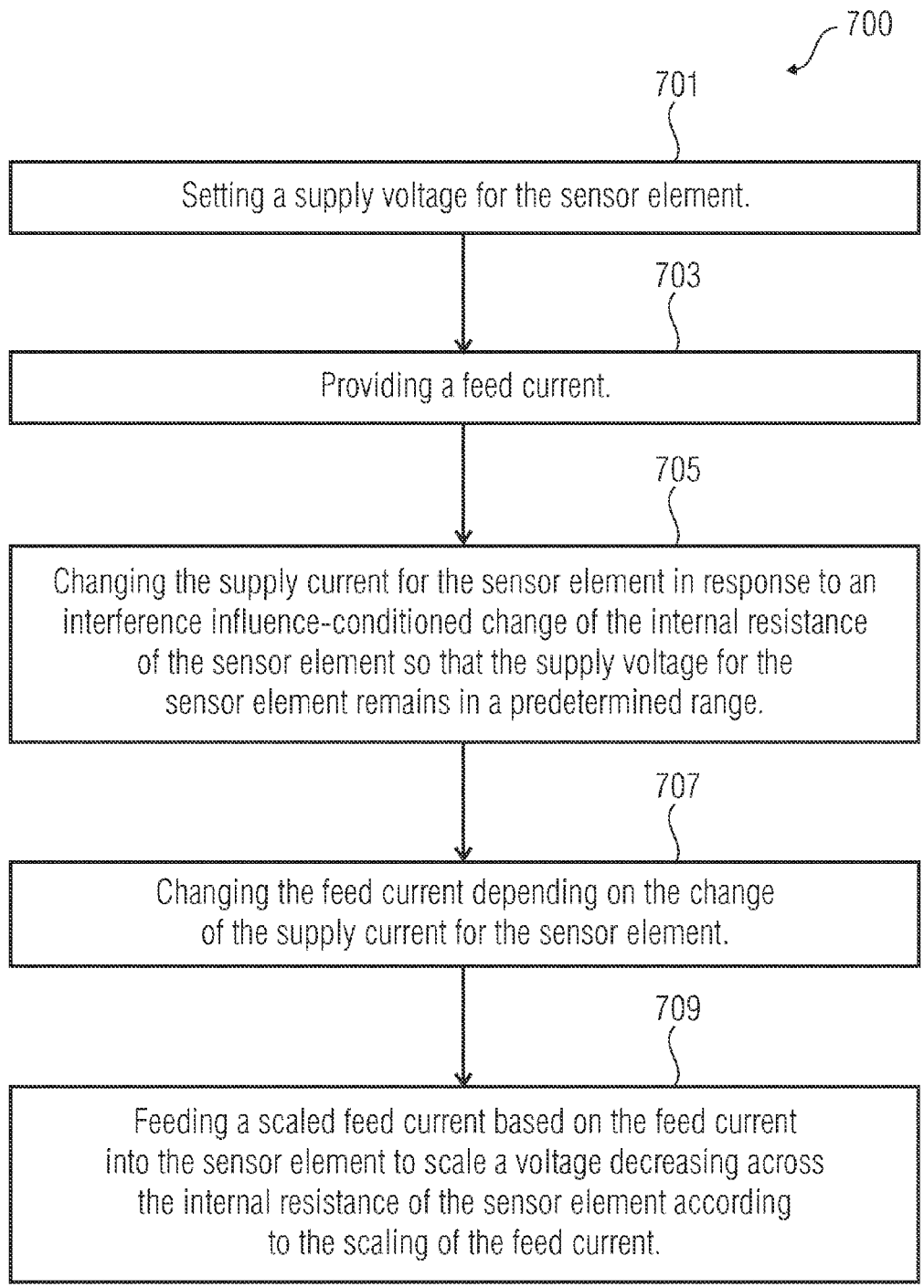
FIG. 7 is a flowchart of a method according to a further embodiment.

FIG. 7 shows a method 700 for a sensor arrangement with a sensor element which comprises an internal resistance.

The method 700 comprises a step 701 of setting a supply voltage for the sensor element.

Further, the method 700 comprises a step 703 of providing a feed current.

Further, the method 700 includes a step 705 of changing a supply current for the sensor element in response to an interference influence-conditioned change of the internal resistance of the sensor element so that the supply voltage for the sensor element remains in a predetermined range.

Further, the method 700 includes a step 707 of changing the feed current depending on the change of the supply current for the sensor element.

Further, the method 700 includes a step 709 of feeding a scaled feed current based on the feed current into the sensor element to scale a voltage decreasing across the internal resistance of the sensor element according to the scaling of the feed current.

The method 700 may, for example, be executed using one of the sensor arrangements 400 and 500.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A sensor arrangement, comprising:
a current regulator;
a reference resistance;
a feed current scaler; and
a sensor element comprising an internal resistance, wherein the internal resistance of the sensor element and the reference resistance comprise a predetermined ratio with respect to each other;
wherein the current regulator is implemented to provide a reference current by the reference resistance and, in response to an interference influence-conditioned change of the reference resistance, change the reference current such that the voltage decreasing across the reference resistance remains in a predetermined range around an applied set voltage;
wherein the current regulator is further implemented to provide a feed current to the feed current scaler and to change a magnitude of the feed current depending on a magnitude of the reference current; and
wherein the feed current scaler is implemented, based on the feed current, to supply a scaled feed current into the sensor element to scale a voltage decreasing across the internal resistance of the sensor element according to the scaling of the feed current.

2. The sensor arrangement according to claim 1,
wherein the current regulator is implemented to change the magnitude of the feed current proportional to the magnitude of the reference current in a ratio which results from the ratio between the reference resistance and the internal resistance of the sensor element and from a ratio between the set voltage and a voltage across the internal resistance decreasing with no or a minimum scaling of the feed current.

3. The sensor arrangement according to claim 1,
wherein the reference resistance is implemented such that certain interference influences which cause changes of the internal resistance of the sensor element change the magnitude of the reference resistance in a corresponding ratio so that the voltage decreasing across the internal resistance of the sensor element is independent of these interference influences within a tolerance range.

4. The sensor arrangement according to claim 1,
wherein the current regulator and the reference resistance are implemented to execute the change of the feed current such that with the interference influence-conditioned change of the reference resistance and an accompanying interference influence-conditioned change of the internal resistance of the sensor element the voltage decreasing across the internal resistance remains in a predetermined range.

5. The sensor arrangement according to claim 1,
which is implemented to generate the voltage decreasing across the internal resistance of the sensor element such that the same counteracts an offset proportion in an output signal of the sensor arrangement.

6. The sensor arrangement according to claim 1,
wherein a material of the reference resistance and a material of the internal resistance within a tolerance range comprise the same performance with respect to an interference influence such that a change of the reference resistance caused by an interference influence causes a unidirectional change of the internal resistance of the sensor element scaled according to the ratio between the reference resistance and the internal resistance of the sensor element.

7. The sensor arrangement according to claim 1,
wherein dimensions of the reference resistance scale with dimensions of the internal resistance of the sensor element according to the ratio between the reference resistance and the internal resistance of the sensor element.

8. The sensor arrangement according to claim 1,
wherein the reference resistance is implemented so that its resistance value experiences a temperature-conditioned change of the internal resistance of the sensor element according to the ratio between the reference resistance and the internal resistance of the sensor element.

9. The sensor arrangement according to claim 1,
further comprising a temperature-stable reference voltage source for generating the set voltage and wherein the current regulator is implemented to regulate the reference current such that the voltage across the reference resistance corresponds to the set voltage within a predetermined tolerance range.

10. The sensor arrangement according to claim 1,
wherein the current regulator comprises a regulating amplifier and a current provider;
wherein the regulating amplifier is implemented to provide a differential signal which describes a deviation of the voltage decreasing across the reference resistance from the set voltage; and
wherein the current provider is implemented, based on the differential signal, to provide the reference current and the supply current such that the supply current is proportional to the reference current.

11. A sensor arrangement, comprising:
a voltage regulator;
a feed current scaler; and
a sensor element comprising an internal resistance;
wherein the voltage regulator is implemented to set a supply voltage for the sensor element and, in response to an interference influence-conditioned change of the internal resistance of the sensor element, to change a supply current of the sensor element such that the supply voltage for the sensor element remains in a predetermined range;
wherein the voltage regulator is further implemented to provide a feed current to the feed current scaler and to change this feed current depending on the change of the supply current for the sensor element; and
wherein the feed current scaler is implemented, based on the feed current, to supply a scaled feed current into the sensor element, to scale a voltage decreasing across the internal resistance of the sensor element according to the scaling of the feed current.

12. The sensor arrangement according to claim 11,
wherein the voltage regulator is implemented to set the feed current such that a change of the feed current within a tolerance range is proportional to a change of the supply current.

13. The sensor arrangement according to claim 11,
wherein the voltage regulator is a foot-point regulator and is implemented to provide a foot-point voltage at the sensor element to change, in response to the change of the internal resistance of the sensor element, the supply current of the same such that the foot-point voltage remains in a predetermined range and to set the feed current proportional to the supply current within a tolerance range.

14. The sensor arrangement according to claim 13,
further comprising a feeding regulator which is implemented to provide a sensor voltage at the sensor element and which acts as a current source for the supply current;
wherein the foot-point regulator acts as a current sink for the supply current;
wherein the supply voltage corresponds to a difference between the sensor voltage and the foot-point voltage;
wherein the foot-point regulator and the feeding regulator, when changing the internal resistance of the sensor element, change the supply current in cooperation such that the supply voltage for the sensor element remains in the predetermined range; and
wherein the foot-point regulator is implemented to set the feed current depending on the supply current and to transfer changes of the supply current to the feed current.

15. The sensor arrangement according to claim 11,
wherein the voltage regulator is a feeding regulator and is implemented to provide a sensor voltage at the sensor element to change, in response to the change of the internal resistance of the sensor element, the supply current of the same so that the sensor voltage remains in a predetermined range and to set the feed current proportional to the supply current within a tolerance range.

16. The sensor arrangement according to claim 15,
further comprising a foot-point regulator which is implemented to provide a foot-point voltage at the sensor element and which acts as a current sink for the supply current;
wherein the feeding regulator acts as a current source for the supply current;
wherein the supply voltage corresponds to a difference between the sensor voltage and the foot-point voltage;
wherein the foot-point regulator and the feeding regulator, with the change of the internal resistance of the sensor element, change the supply current in cooperation such that the supply voltage for the sensor element remains within the predetermined range; and
wherein the feeding regulator is implemented to set the feed current depending on the supply current and to transfer changes of the supply current to the feed current.

17. The sensor arrangement according to claim 14,
wherein the foot-point regulator and the feeding regulator are implemented, in response to the change of the internal resistance of the sensor element, to change the supply current so that the sensor voltage and the foot-point voltage remain within ranges predetermined for the same.

18. The sensor arrangement according to claim 13,
wherein the feeding regulator or the foot-point regulator which provides the feed current comprises a regulating amplifier and a current provider;
wherein the regulating amplifier is implemented to provide a differential signal which describes a deviation of the foot-point voltage or the sensor voltage from a set voltage; and
wherein the current provider is implemented, based on the differential signal, to provide the feed current such that a change of the feed current within a tolerance range is proportional to a change of the supply current.

19. The sensor arrangement according to claim 11,
which is implemented to provide the supply current and the scaled feed current at respectively different terminals of the sensor element.

20. The sensor arrangement according to claim 1,
further comprising a scaling regulator;
wherein the scaling regulator is implemented, based on an output signal of the sensor arrangement, to provide a scaling signal to the feed current scaler;
wherein the feed current scaler is implemented, based on the scaling signal, to provide the scaled feed current so that the voltage decreasing in the sensor element counteracts an offset proportion in the output signal of the sensor arrangement.

21. The sensor arrangement according to claim 20,
further comprising an output amplifier for providing the output signal depending on a sensor signal of the sensor element;
wherein the scaling regulator provides the scaling signal depending on a sensor offset and an output amplifier offset such that the voltage decreasing across the internal resistance of the sensor element counteracts both the sensor offset and also the output amplifier offset.

22. The sensor arrangement according to claim 18,
wherein the sensor element is a sensor in bridge circuit or a Hall element; and
wherein the feed current scaler is implemented to select, depending on the scaling signal, a sign of the voltage generated in the sensor element by switching a feed point at the sensor element for the scaled feed current.

23. The sensor arrangement according to claim 1,
which is implemented to impress the scaled feed current at a terminal of the sensor element into the sensor element at which a sensor signal or at least a part of the sensor signal is provided by the sensor element to reduce an offset existing in the sensor signal.

24. The sensor arrangement according to claim 1,
wherein the sensor element comprises four terminals; and
which is implemented to provide the scaled feed current in a temporal sequence at each of the four terminals of the sensor element.

25. The sensor arrangement according to claim 1,
wherein the sensor element is a Hall sensor.

26. A method in a sensor arrangement with a sensor element comprising an internal resistance, comprising:
providing a reference current by a reference resistance;
providing a feed current;
changing the reference current in response to an interference influence-conditioned change of the internal resistance of the sensor element such that a voltage decreasing across the reference resistance remains in a predetermined range around an applied set voltage;
changing a magnitude of the feed current depending on a magnitude of the reference current; and
feeding a scaled feed current based on the feed current into the sensor element to scale a voltage decreasing across the internal resistance of the sensor element according to the scaling of the feed current;
wherein the reference resistance and the internal resistance comprise a predetermined ratio with respect to each other.

27. A method in a sensor arrangement with a sensor element comprising an internal resistance, comprising:
setting a supply voltage for the sensor element;
providing a feed current;
changing a supply current for the sensor element in response to an interference influence-conditioned change of the internal resistance of the sensor element so that the supply voltage for the sensor element remains within a predetermined range;

changing the feed current depending on the change of the supply current for the sensor element; and feeding a scaled feed current based on the feed current into the sensor element to scale a voltage decreasing across the internal resistance of the sensor element according to the scaling of the feed current.

* * * * *